United States Patent
Burroughes et al.

(10) Patent No.: US 10,559,753 B2
(45) Date of Patent: Feb. 11, 2020

(54) DOPING ORGANIC SEMICONDUCTORS

(71) Applicant: Cambridge Display Technology Limited, Godmanchester (GB)

(72) Inventors: Jeremy Burroughes, Cambridge (GB); Christopher Newsome, St. Ives (GB); Daniel Tobjörk, Hartford (GB); Mark Dowling, Elsworth (GB)

(73) Assignee: Cambridge Display Technology Limited, Godmanchester (GB)

( * ) Notice: Subject to any disclaimer, the term of this patent is extended or adjusted under 35 U.S.C. 154(b) by 222 days.

(21) Appl. No.: 15/508,619

(22) PCT Filed: Aug. 27, 2015

(86) PCT No.: PCT/EP2015/069675
§ 371 (c)(1),
(2) Date: Mar. 3, 2017

(87) PCT Pub. No.: WO2016/034498
PCT Pub. Date: Mar. 10, 2016

(65) Prior Publication Data
US 2017/0279046 A1  Sep. 28, 2017

(30) Foreign Application Priority Data
Sep. 5, 2014 (GB) .................................. 1415708.5

(51) Int. Cl.
*H01L 51/00* (2006.01)
*H01L 51/10* (2006.01)
(Continued)

(52) U.S. Cl.
CPC .......... *H01L 51/002* (2013.01); *H01L 27/283* (2013.01); *H01L 51/0508* (2013.01); *H01L 51/105* (2013.01)

(58) Field of Classification Search
CPC ............. H01L 51/0508; H01L 51/0512; H01L 51/0541; H01L 51/0545; H01L 51/0558;
(Continued)

(56) References Cited

U.S. PATENT DOCUMENTS 6,806,124 B2 * 10/2004 Klauk ................... H01L 51/105
257/40
7,404,981 B2 * 7/2008 Zhang ................. H01L 51/0021
427/256
(Continued)

FOREIGN PATENT DOCUMENTS

JP  2006-261232 A  9/2006

OTHER PUBLICATIONS

Search Report dated Mar. 5, 2015 for Application No. GB 1415708.5.
(Continued)

*Primary Examiner* — Jose R Diaz
(74) *Attorney, Agent, or Firm* — Wolf, Greenfield & Sacks, P.C.

(57) ABSTRACT

We describe a method for reducing a parasitic resistance at an interface between a conducting electrode region and an organic semiconductor in a thin film transistor, the method comprising: providing a solution comprising a dopant for doping said semiconductor, and depositing said solution onto said semiconductor and/or said conducting electrode region to selectively dope said semiconductor adjacent said interface between said conducting electrode region and said semiconductor, wherein depositing said solution comprises inkjet-printing said solution.

19 Claims, 19 Drawing Sheets

(51) Int. Cl.
*H01L 51/05* (2006.01)
*H01L 27/28* (2006.01)

(58) Field of Classification Search
CPC ............. H01L 51/0566; H01L 51/0005; H01L 51/0022; H01L 51/002
See application file for complete search history.

(56) References Cited

U.S. PATENT DOCUMENTS

| | | |
|---|---|---|
| 2005/0181566 A1 | 8/2005 | Machida et al. |
| 2008/0160265 A1 | 7/2008 | Hieslmair et al. |
| 2011/0186830 A1 | 8/2011 | Burroughes et al. |
| 2013/0134392 A1 | 5/2013 | Afzali-Ardakani et al. |

OTHER PUBLICATIONS

International Search Report and Written Opinion dated Nov. 10, 2015 for Application No. PCT/EP2015/069675.
Noda et al., Current Enhancement with Contact-Area-Limited Doping for Bottom-Gate, Bottom-Contact Organic Thin-Film Transistors. Japan J Appl Phys. Feb. 1, 2013;52(2):21602.1-6.

\* cited by examiner

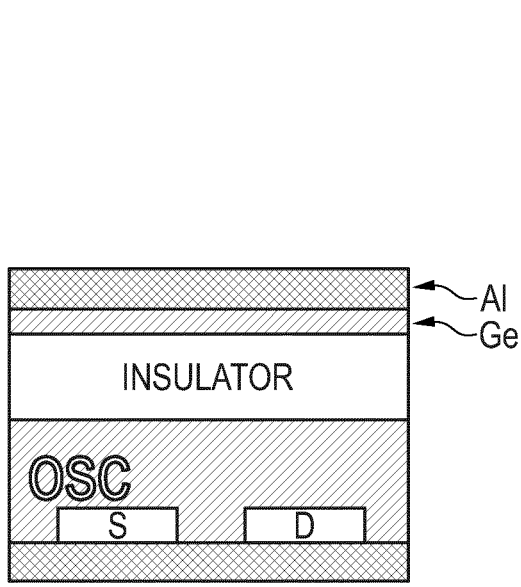
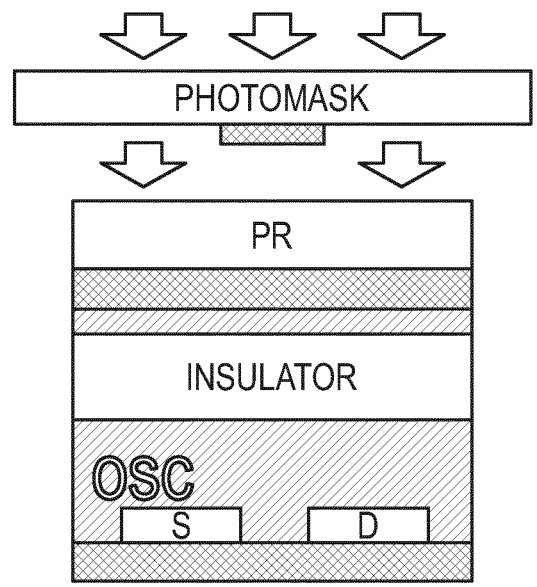
Fig. 2a          Fig. 2b
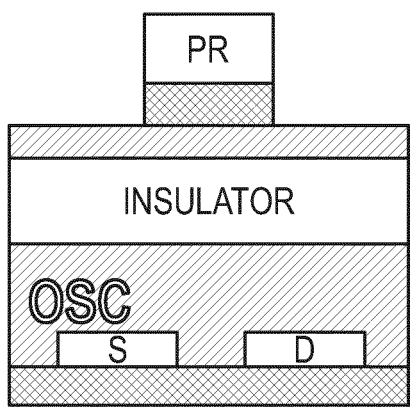
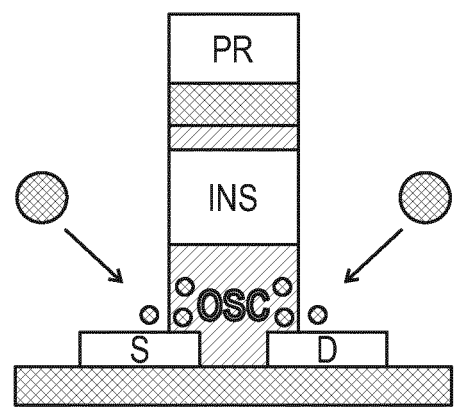
Fig. 2c          Fig. 2d

| Gate bias (V) | Dopant at SD | Reference | Solvent at SD |
|---|---|---|---|
| -20 | 41.6 | 119.1 | 132 |
| -30 | 7.5 | 21.5 | 29.9 |
| -40 | 2.2 | 6.9 | 16.4 |

| Gate bias (V) | Before dopant | After dopant |
|---|---|---|
| -20 | 248.7 | 100.5 |
| -30 | 28.6 | 17.9 |
| -40 | 11.2 | 9.5 |

| Gate bias (V) | Before solvent | After solvent |
|---|---|---|
| -20 | 240.9 | 237.9 |
| -30 | 48.3 | 52.3 |
| -40 | 10.5 | 13.2 |

| Gate bias (V) | Before F4TCNQ | After F4TCNQ |
|---|---|---|
| -20 | 207.2 | 176.8 |
| -30 | 28.8 | 24.2 |
| -40 | 6.1 | 5.7 |

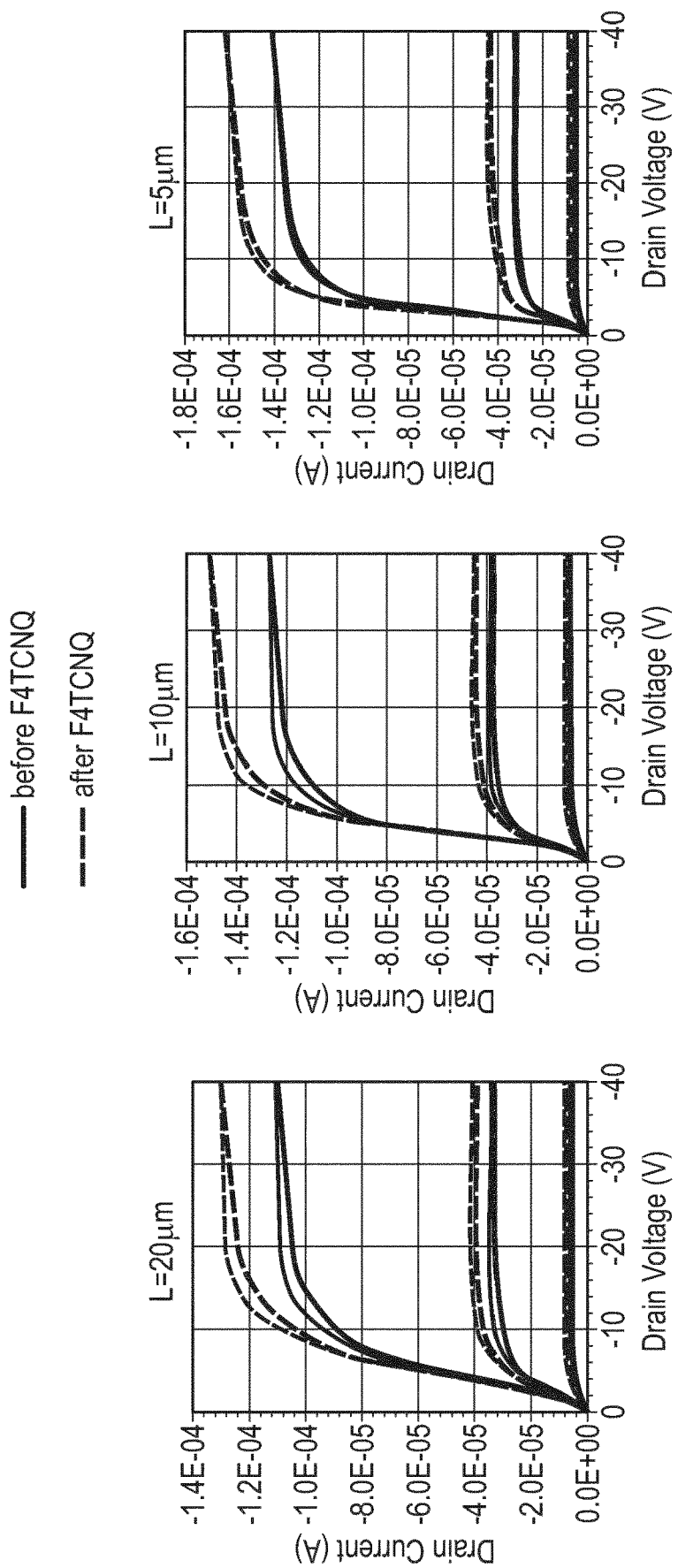

DOPING ORGANIC SEMICONDUCTORS

RELATED APPLICATIONS

This application is a national stage filing under 35 U.S.C. § 371 of international PCT application, PCT/EP2015/069675, filed Aug. 27, 2015, which claims priority to United Kingdom patent application, GB 1415708.5, filed Sep. 5, 2014, each of which is incorporated herein by reference in its entirety.

FIELD OF THE INVENTION

The invention generally relates to techniques for doping an organic semiconductor, in particular in a thin film transistor, and to the resulting devices.

BACKGROUND TO THE INVENTION

In inorganic semiconductors, doping generally refers to incorporating impurities into a semiconductor of an electronic device of an electric circuit. The amount of impurities is usually small compared to the concentration of the semiconductor. Impurities are defects in the semiconductor which are used to change the properties of the semiconducting host material, in particular the crystal structure or the electrical conductivity of the semiconductor. For organic semiconductors, where materials can be either amorphous or crystalline, doping may be achieved chemically by incorporating a material as part of the semiconductor film.

Controlled doping of a semiconductor has been exploited to improve and precisely tune transistor characteristics. A doped semiconductor forms an essential element of a metal-oxide-semiconductor field-effect transistor (MOSFET). Generally, the substrate of a MOSFET is made of doped silicon. Background prior art can be found in DE 20 2006 002 359 U1, DE 20 2005 009 260 U1, DE 20 2005 012 932 U1, DE 20 2005 009 955 U1, DE 20 2005 016 611 U1, DE 20 2005 019 360 U1 and U.S. Pat. No. 7,435,668.

A thin film transistor is a type of field-effect transistor with an isolated gate electrode. Thin film transistors are exploited, for example, in TFT-displays. A difference between a MOSFET and a thin film transistor is that the semiconducting active layer in a thin film transistor is generally prepared on top of an insulating substrate.

In order to switch on a thin film transistor, a gate voltage is applied to the gate electrode. This results in the generation of a charge accumulation layer in the semiconductor. The sign of the voltage to be applied to the gate electrode to switch the transistor on or off, respectively, is dependent on the type of semiconductor (n-type or p-type) exploited.

Contact resistance in devices such as thin film transistors is a parasitic effect that gives rise to a loss in a voltage drop across the active region of the device, thus leading to reduced output current levels. Consequently, the device mobility is compromised and does not achieve the mobility potential of the semiconductor material. Minimisation of the contact resistance, associated with charge carrier injection from a source (or drain) electrode into the semiconductor, is paramount for high mobility semiconductors at short channel length (10 μm and less). In order to achieve this, the surface of the conducting electrode may be treated prior to deposition of the semiconductor so as to shift the work function of the conducting electrode from its native value. In addition to the interfacial resistance at the electrodes, parasitic resistances associated with charge carrier transport in the bulk of the semiconductor film may also limit the potential for realising high device mobilities. Collectively, these two contributions of resistances are from now termed as parasitic contact resistances.

SUMMARY OF THE INVENTION

According to a first aspect of the invention, there is therefore provided a method for reducing a parasitic resistance at an interface between a conducting electrode region and a semiconductor in a thin film transistor as specified in claim 1. The method comprises: providing a solution comprising a dopant for doping said semiconductor, and depositing said solution onto said semiconductor and/or said conducting electrode region to selectively dope said semiconductor adjacent said interface between said conducting electrode region and said semiconductor, wherein depositing said solution comprises inkjet-printing said solution.

The inventors have recognised that to address the problems associated with parasitic resistance, dopants may be used as additives to the semiconductor film. However, when the dopant is added to the semiconductor material in the bulk before deposition, this has a negative impact in that the entire film comprises the dopant, thus, in particular in the case of a thin film transistor, leading to an undesirable increase in off-current levels.

Therefore, doping of the bulk of the semiconductor, in particular in a thin film transistor is generally avoided because a highly conductive semiconductor would not allow for a clear switching behaviour of the thin film transistor between the on- and off-state, respectively. If the semiconductor were highly doped, the charge carrier concentration in the bulk of the semiconductor is of the same order as the charge carrier concentration in the charge accumulation layer obtained by applying a gate voltage. Therefore, adding a dopant to the bulk of the semiconductor in a thin film transistor results in high leakage currents, i.e. high off-current levels when the gate-source bias is at or near zero.

The embodiments of the invention aim at improving device characteristics of, in particular, but not limited to, thin film transistors and organic light-emitting diodes by doping the semiconductor, contrary to the common general knowledge.

In embodiments of the method, the semiconductor is doped predominantly adjacent an interface between the conducting electrode region and the semiconductor.

Embodiments of the method therefore allow for reducing the parasitic resistance in, e.g. thin film transistors compared to transistors in which no dopant is incorporated into the semiconductor. The semiconductor in a thin film transistor may therefore be doped predominantly adjacent an interface between a conducting electrode region (conducting source and/or drain electrode region) and the semiconductor, i.e. there is little or no dopant in the channel of the transistor.

Embodiments of the method provide a way to localise a dopant adjacent the conducting source and drain electrode regions by a solution process, thus minimising the risk of diffusion into the channel region which would lead to increased off-current levels. The (parasitic) contact resistance is hereby reduced by aligning the energy levels of the semiconductor with the energy level of the electrode upon doping the semiconductor. Furthermore, device performance may be improved due to an increase in conductivity of the semiconductor in a region where the dopant is introduced. The (parasitic) access resistance, i.e. the resistance through the bulk of the semiconductor (for example in a thin film transistor from a source or drain electrode region to the semiconductor/gate-insulator interface), may therefore be reduced.

Methods described herein therefore allow for a reduction in parasitic resistance, i.e. contact resistance and/or access resistance. A reduction in parasitic resistance becomes increasingly important to device performance as the channel length decreases, due to an increasing relative proportion of parasitic to channel region resistances.

In a related aspect the invention provides an organic electronic device, wherein a semiconductor layer of said organic electronic device comprises a dopant, and wherein said dopant dopes said semiconductor layer predominantly at an interface between an electrode region of said organic electronic device and said semiconductor layer.

In a preferred embodiment, the organic electronic device is a thin film transistor, in particular an organic thin film transistor. The dopant may dope the semiconductor layer of the thin film transistor predominantly at an interface between the semiconductor and the conducting source and/or drain electrode region, respectively, such that there is no (or little) dopant in the channel region of the thin film transistor.

In another embodiment, the organic electronic device may be an organic light-emitting diode (OLED). The dopant may dope the organic semiconductor of the OLED predominantly at an interface between the organic semiconductor and a conducting electrode region, for example the top electrode region of the OLED. In one embodiment, the organic semiconductor may be selectively doped prior to depositing the top electrode onto the organic semiconductor.

The skilled person will appreciate that thin film transistor and OLED are merely examples in which the semiconductor may be doped as described in the present specification. It will be understood that other devices and device architectures may be prepared which comprise a doped semiconductor as outlined herein.

When the solution comprising the dopant is deposited onto a conducting electrode region, the dopant diffuses partially into the bulk of the semiconductor, thereby doping the semiconductor adjacent the interface between the conducting electrode region and the semiconductor. In order to be able to deposit the solution comprising the dopant onto a conducting electrode region adjacent the interface between the conducting electrode region and the semiconductor, a lithography technique may be exploited to provide access to a part of the conducting electrode region.

When the solution comprising the dopant is deposited onto the semiconductor, the dopant diffuses into the bulk of the semiconductor, and the method described herein allows for incorporating the dopant into the semiconductor predominantly in a region adjacent the interface between the semiconductor and the conducting electrode region. As will be described below, the dopant may be incorporated into the bulk of the semiconductor before depositing gate-insulator and gate electrode, in the case of a top-gate configuration in the example of a thin film transistor.

In a preferred embodiment, the solution comprising the dopant is an orthogonal solvent. Using an orthogonal solvent may prevent the semiconductor from being dissolved upon deposition of the solvent onto the semiconductor during the doping process.

The skilled person will appreciate that the conducting electrode region specified in the methods and devices described herein may comprise a conducting material, such as, but not limited to, a metal, a conducting polymer, and the like.

In a preferred embodiment of the invention, the dopant may be incorporated into the semiconductor by printing, in particular inkjet-printing the solution comprising the dopant. The solution may be printed onto the semiconductor such that the solution diffuses into the bulk of the semiconductor. Alternatively, the solution may be printed onto a conducting electrode region adjacent the interface between the conducting electrode region and the semiconductor, such that the solution, and therefore the dopant, diffuses into the semiconductor in this manner.

In some embodiments, the dopant may be deposited by dip-coating, dispense printing, and the like. The skilled person will appreciate that a variety of deposition techniques may be used in order to incorporate the dopant into the semiconductor.

It will be understood that when a conducting polymer or another soluble material is exploited as a conducting electrode, preferably, the solution comprising the dopant does not dissolve the conducting electrode.

Usually, dopants for incorporating at the vicinity of the source and drain electrodes in thin film transistors are incorporated into the semiconductor by using an evaporating technique through use of a shadow mask process. However, evaporation of the dopant risks doping of the semiconductor in the channel region of a transistor. This is disadvantageous as outlined above because of an increase in off-current levels. High off-current levels may be expected when evaporating the dopant through a shadow-mask because of the limitation in resolution of the shadow mask, which is typically of the order 20-40 µm. In contrast, inkjet-printing allows for incorporating the dopant into the bulk of the semiconductor predominantly in the region of the interface between the conducting electrode region and the semiconductor. A resolution of higher than 10 µm, preferably higher than 5 µm, more preferably higher than 1 µm may be achieved using the methods described herein, in particular when inkjet-printing is exploited, which becomes important, for example for transistors with a channel length of less than 10 µm.

Printing, in particular inkjet-printing, facilitates the possibility to deliver the dopant in a flexible manner as outlined in the methods described herein. In one example, the dopant comprises a solution-processable electron acceptor material. The dopant may be any one of Molybdenum tris-[1,2-bis(trifluoromethyl)ethane-1,2-dithiolene (Mo(tfd)3), 2,3,5,6-tetrafluoro-7,7,8,8-tetracyanoquinodimethane (F4-TCNQ) or NovaLED®NDP-9. It will be understood that when the semiconductor is doped with different dopants at different regions, as outlined below, any combination of dopants may be used.

The skilled person will appreciate that there is a variety of options available when doping the semiconductor using the method described above. These options are outlined in the following paragraphs. However, it will be understood that the methods described herein are not limiting, and further variants will be apparent to those skilled in the art.

Some embodiments described herein generally relate to transistors in a bottom-contact/top-gate configuration. However, it will be appreciated that methods described herein may also be applied to other transistor configurations, such as, but not limited to, a bottom-contact/bottom-gate transistor, a top-contact/top-gate transistor, a top-contact/bottom-gate transistor, or a transistor with asymmetrically placed source and drain contacts, e.g. a top-source/bottom-drain configuration and the like. The person skilled in the art will immediately understand that modifications in the order of preparation steps for the various elements of the transistor will be necessary for different transistor configurations.

Furthermore, the skilled person will appreciate that a reference to a thin film transistor is not limiting to this specific type of transistor, and other types of transistors may be prepared using embodiments of the method described herein.

In one embodiment of the method, the solution which comprises the dopant may be deposited onto one or both of a first conducting electrode region and a second conducting electrode region. The skilled person will understand that first and second conducting electrode region refers to conducting source and drain electrode regions when reference is being made to a thin film transistor. 'First' and 'second' are used in this description, where applicable, so as to avoid implying an asymmetry with respect to conducting source and drain electrode region, respectively, per se.

As described above, when the solution is deposited onto a conducting electrode region, the solution diffuses into the semiconductor to dope the semiconductor adjacent the interface between the conducting electrode region onto which the solution is deposited and the semiconductor. It will be understood that the dopant may be introduced into the semiconductor to obtain an asymmetric device.

Alternatively, the solution may be deposited onto a region of the semiconductor where the semiconductor substantially covers one or both of the first conducting electrode region and the second conducting electrode region. As described above, in this case, the solution comprising the dopant diffuses into the bulk of the semiconductor to selectively dope the semiconductor predominantly at the interface between the semiconductor and the conducting electrode region.

In one embodiment of the method, a first solution comprising a first dopant may be deposited onto a first conducting electrode region, and a second solution comprising a second dopant may be deposited onto a second conducting electrode region. This method may be particularly useful when the first and second conducting electrode regions comprise different materials with different properties, in particular different energy levels. In this case, a different dopant may be used to optimise alignment of energy levels between the semiconductor and the respective material used as a conducting electrode. It will be appreciated that, alternatively, the first solution comprising the first dopant may be deposited onto a first region of the semiconductor where the semiconductor substantially covers the first conducting electrode region, and the second solution comprising the second dopant may be deposited onto a second region of the semiconductor where the semiconductor substantially covers the second conducting electrode region.

In a preferred embodiment of the method, an asymmetric device may be prepared by doping the semiconductor at a first concentration adjacent an interface between the semiconductor and the first conducting electrode region, and doping the semiconductor at a second concentration adjacent an interface between the semiconductor and the second conducting electrode region. The skilled person will appreciate that a combination of different dopants and different concentrations may be used to selectively dope the semiconductor adjacent the two different interfaces between the semiconductor and first and second conducting electrode regions, respectively, to obtain an asymmetric device.

In a related aspect the invention provides a method for doping a semiconductor, the method comprising: providing a substrate, said substrate bearing a conducting source electrode region and a conducting drain electrode region, depositing said semiconductor onto said substrate such that said semiconductor forms a layer on said substrate which covers said conducting source electrode region and said conducting drain electrode region, printing a solution comprising a dopant onto said semiconductor in an area where said semiconductor layer substantially covers one or both of said conducting source electrode region and said conducting drain electrode region, to selectively dope said semiconductor in said area.

In a preferred embodiment of the method, a layer of gate insulator may then be deposited onto the layer of semiconductor before depositing a gate electrode onto the layer of gate insulator to prepare, in this example, a bottom-contact/top-gate thin film transistor.

In a further aspect the invention provides a method for doping a semiconductor in a thin film transistor, the method comprising: providing a thin film transistor, said thin film transistor comprising conducting source and drain bottom electrode regions, said semiconductor, a gate insulator region and a conducting top gate electrode region, depositing a photoresist onto said conducting top gate electrode region, selectively exposing said photoresist to UV light through a photomask, developing said photoresist, etching said conducting top gate electrode region, said gate insulator region and said semiconductor to remove said conducting top gate electrode region, said gate insulator region and said semiconductor in an area over said conducting source and drain bottom electrode regions, wherein said area is not covered by said photoresist after developing said photoresist, and printing a solution comprising a dopant onto one or both of said conducting source and drain bottom electrode regions in said area such that said dopant diffuses into said semiconductor to selectively dope said semiconductor adjacent an interface between said semiconductor and said one or both of said conducting source and drain bottom electrode regions, respectively.

The transistor as prepared using any of the methods described in this specification may then be incorporated into a sensor, a display or another device. Therefore, one aspect of the invention provides a method of making a sensor or display, the sensor or display comprising a transistor, said transistor comprising a semiconductor, wherein said semiconductor is doped using any one of the methods described herein.

In a preferred embodiment of the organic electronic device, the dopant extends through the bulk of the semiconductor layer from the electrode region to an upper surface of the semiconductor layer, wherein a channel region of the organic electronic device is substantially free of the dopant.

In a further preferred embodiment of the organic electronic device, the electrode region extends beyond the semiconductor layer, wherein the dopant extends from the interface between the electrode region of the organic electronic device and the semiconductor layer to a lateral edge of the semiconductor layer, and wherein a channel region of the organic electronic device is substantially free of the dopant.

In embodiments of the methods and devices, the semiconductor is an organic semiconductor. The skilled person will appreciate that methods described herein are particularly suitable for doping organic semiconductors as the solution comprising the dopant may easily diffuse into the soft organic matrix.

It will be understood that the semiconductor may be any one of, but is not limited to, a polymer, a small molecule, an organometallic compound and the like.

In a further related aspect the invention provides a sensor or display comprising the organic electronic device as described in the present specification. In one embodiment, the display may be a thin film transistor display, or an OLED display.

BRIEF DESCRIPTION OF THE DRAWINGS

These and other aspects of the invention will now be further described by way of example only, with reference to the accompanying figures in which:

FIGS. 2a-d show schematic illustrations of a further example fabrication route for doping a semiconductor according to embodiments of the present invention;

FIG. 14 shows peak saturation mobility before and after doping according to embodiments of the present invention;

FIGS. 15a-c show output characteristics, parasitic resistance and transfer characteristics before and after doping according to embodiments of the present invention;

DETAILED DESCRIPTION OF PREFERRED EMBODIMENTS

In this example, inkjet-printing is used to dope an organic semiconductor in order to reduce a parasitic resistance between an organic semiconductor and conducting source and drain electrode regions, respectively. Here, small molecules and polymers are doped using Mo(tfd)3, F4-TCNQ or NPD-9.

There is a variety of ways in which to dope the semiconductor using inkjet-printing. FIG. 1 shows schematic illustrations of a first example fabrication route for printing of dopant materials at the conducting source and drain electrode regions through the semiconductor. The schematic illustrations are not to scale.

Figure 1A:
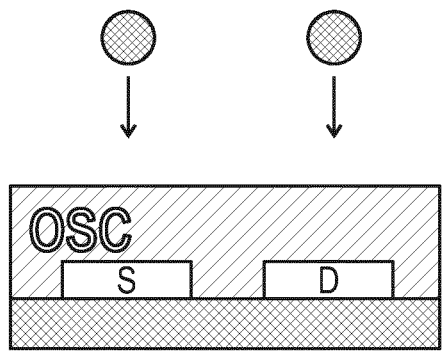
FIGS. 1a-c show schematic illustrations of a first example fabrication route for doping a semiconductor according to embodiments of the present invention.
Figure 1B:
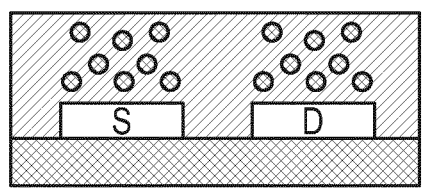
Figure 1C:
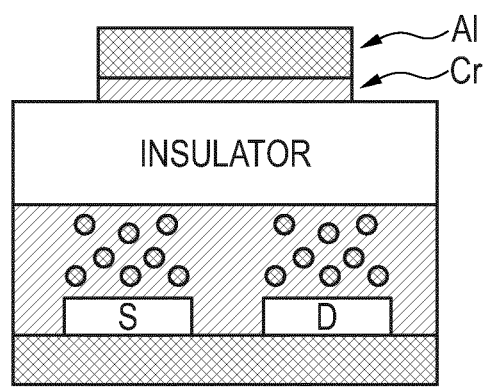

As illustrated in FIG. 1a, a substrate bearing conducting source (S) and drain (D) electrode regions is provided. A layer of organic semiconductor (OSC) is prepared on the substrate such that the organic semiconductor covers the conducting source and drain electrode regions. The person skilled in the art will appreciate that a variety of deposition techniques may be exploited in order to deposit conducting source and drain electrode regions as well as organic semiconductor onto a substrate. In this example, the solution-processed organic semiconductor is spin-coated onto the substrate. It is illustrated in FIG. 1a that the solution comprising the dopant is then inkjet-printed onto the dried organic semiconductor in a region where the organic semiconductor covers conducting source and drain electrode regions. As shown in FIG. 1b, the dopant may then diffuse into the bulk of the organic semiconductor film. The organic semiconductor is only doped, in this example, in the region above the conducting source and drain electrode regions, i.e. adjacent the conducting source and drain electrode regions. FIG. 1c shows the finished thin film transistor in which a gate insulator is prepared on top of the organic semiconductor film. A dielectric layer was then deposited on this semiconductor film. The dielectric material used was the fluorinated polymer polytetrafluoroethylene (PTFE). Other suitable fluorinated polymers that could have been used include perfluoro cyclo oxyaliphatic polymer (CYTOP), perfluoroalkoxy polymer resin (PFA), fluorinated ethylene-propylene (FEP), polyethylenetetrafluoroethylene (ETFE), polyvinylfluoride (PVF), polyethylenechlorotrifluoroethylene (ECTFE), polyvinylidene fluoride (PVDF), polychlorotrifluoroethylene (PCTFE), perfluoro elastomers (FFKM) such as Kalrez® or Tecnoflon®, fluoro elastomers such as Viton®, Perfluoropolyether (PFPE) and a polymer of tetrafluoroethylene, hexafluoropropylene and vinylidene fluoride (THV).

A top-gate, made of a suitable conducting layer, in this example chromium and aluminium, is then deposited on top of the gate insulator. Here, chromium is exploited as an adhesion layer for the insulator.

It will be understood that the specific materials exploited are merely exemplary, and any other suitable materials may be used when preparing the transistor. Standard fabrication process conditions may be used to prepare the various elements of the transistor.

In this fabrication route, a standard gate electrode is deposited onto the insulator film, whereby the gate electrode dimension is determined by the size of the aperture in the shadow mask exploited for evaporation. In this example, a common gate for six transistors covers a lateral area of 3 mm×10 mm. Device test cells at 50 mm×50 mm substrate size are used in this example.

This doping approach reduces the risk of doping the entire channel region or a substantial part thereof. Hence, the parasitic contact resistance is reduced at the interface between the organic semiconductor and the conducting source and drain electrode regions, respectively, without a (substantial) loss in on/off-current ratio.

FIG. 2 shows schematic illustrations of a further example fabrication route for printing of dopant materials at the conducting source and drain electrode regions through the semiconductor. The schematic illustrations are not to scale.

FIG. 2a illustrates a bottom-contact/top-gate thin film transistor comprising an organic semiconductor. In this example, germanium is used as an adhesion layer for the gate insulator. The top-gate is made of aluminium.

In this fabrication route, additional processing steps are required in order to realise higher resolution gate electrodes. In this example, a positive photoresist (PR), Shipley S1813, is employed to facilitate patterning of the gate by a wet etch process. Standard processes and process conditions may be used to deposit the photoresist onto the gate electrode. As illustrated in FIG. 2b, a photomask may then be exploited to expose the hard-baked photoresist, in this example, to UV light. Wet etching results in the removal of the positive photoresist where it has been exposed to UV light. Furthermore, an etchant may be exploited which dissolves the aluminium gate in a region where it is not covered by the photoresist (see FIG. 2c). The skilled person will appreciate that a number of etchants may be used dependent on the material used for the gate electrode. Once the wet etch process is completed, the device layers are dry etched to the source/drain electrode region level using oxygen plasma. In this process step, the remaining gate layer acts as a dry etch mask for the underlying gate insulator and semiconductor layer in the device.

Alternatively, the photoresist may be removed before the dry etch process is conducted. In this example, the photoresist is removed by a rinsing process in a solvent such as acetone which is a selective solvent for the photoresist and not the insulator.

It will be understood that the lithography and etching processes may be adapted towards the specific materials used in the thin film transistor.

A schematic of the resulting patterned transistor structure is illustrated in FIG. 2d. The solution comprising the dopant may then be deposited onto the conducting source and/or drain electrode regions, such that the dopant does not substantially diffuse into the bulk of the semiconductor of the channel region. This allows selective doping of the semiconductor adjacent the interface between the semiconductor and the conducting source and drain electrode regions, respectively, thus minimising the risk of high off-current levels in the device.

Figure 3:
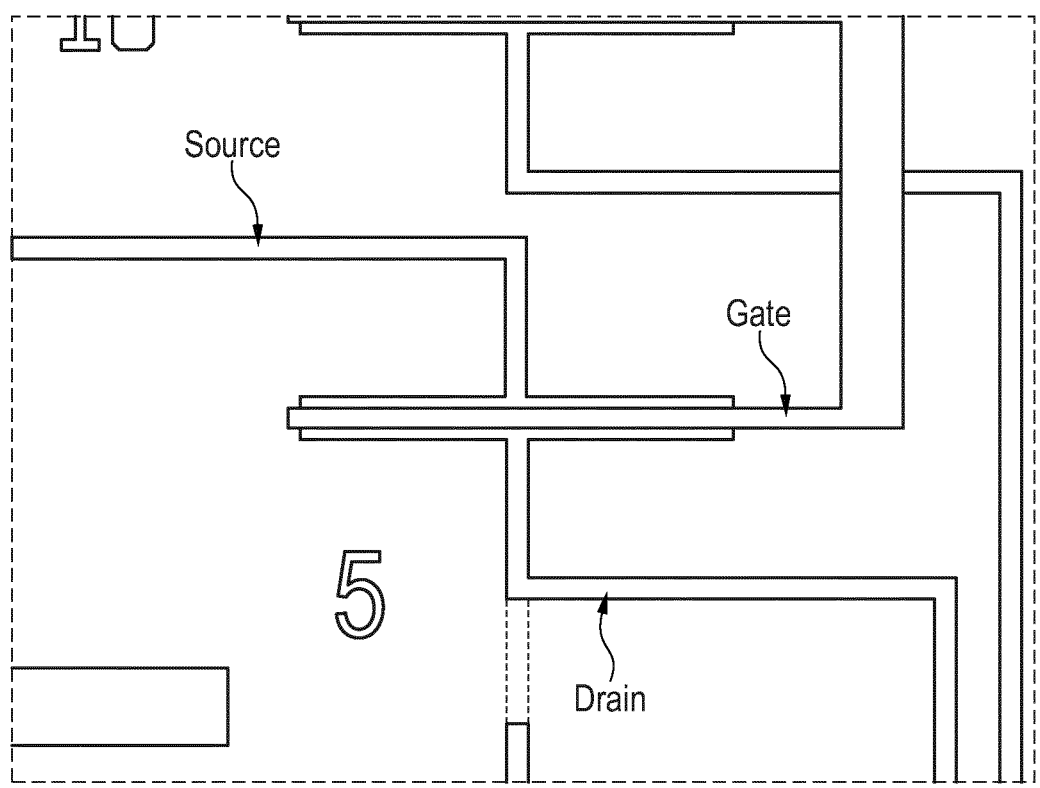
FIG. 3 shows a top view of a photo-patterned transistor according to embodiments of the present invention.

FIG. 3 shows a top view of devices fabricated, as illustrated in FIGS. 2a-d, with photo-patterned gate electrodes in alignment with the underlying source and drain electrode regions. Overlap distances of the gate electrode to the underlying source and drain electrode regions are typically 40 to 50 μm (to each of the source and drain electrode regions).

In order to verify a reduction in parasitic resistance prepared by the methods as outlined above, transport measurements are performed on the transistors.

Figure 4A:
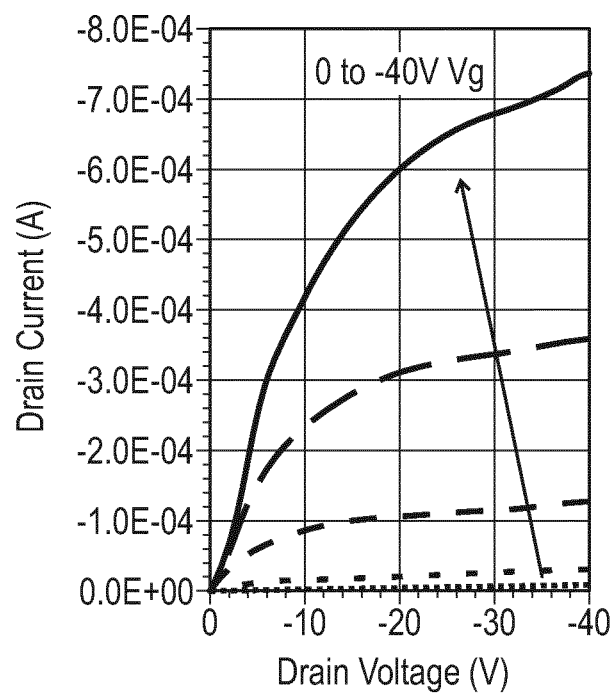
FIGS. 4a and b show, respectively, output characteristics and transfer characteristics of a thin film transistor with a 5 μm channel length, doped according to embodiments of the present invention.
Figure 4B:
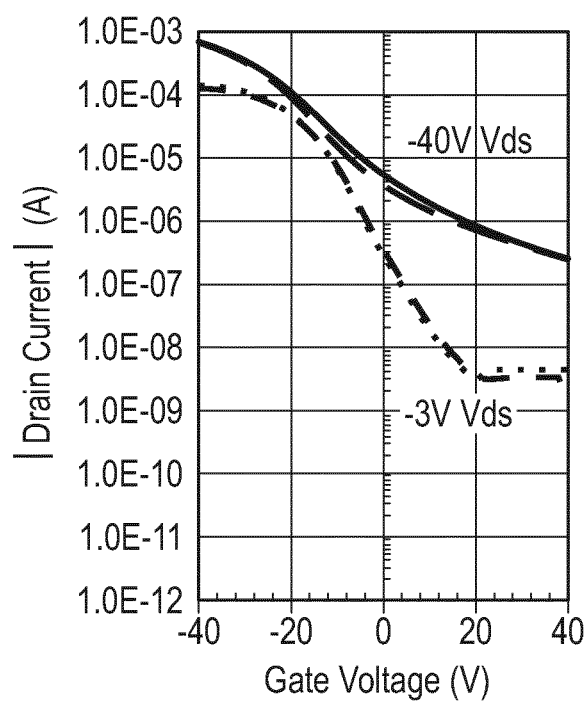

FIGS. 4a and b illustrate, respectively, output and transfer characteristics of a thin film transistor prepared using the method as shown in FIGS. 1a-c. Channel length and width of the thin film transistor in this example are 5 μm and 2 mm, respectively. The dielectric thickness is 287 nm.

Figure 5A:
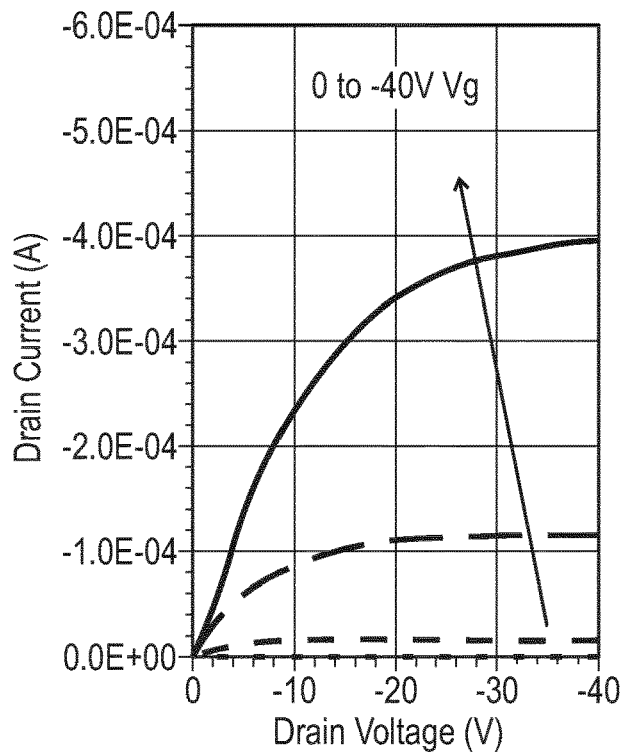
FIGS. 5a and b show, respectively, output characteristics and transfer characteristics of a thin film transistor with a 10 μm channel length, doped according to embodiments of the present invention.
Figure 5B:
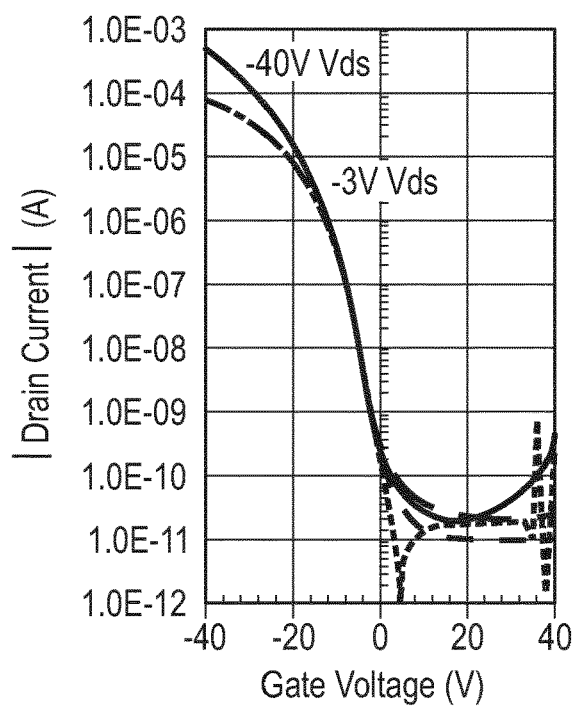

In order to analyse the parasitic resistance, a series of transistors is prepared under identical conditions. The parasitic resistance may then be determined by a transmission line method using a range of channel lengths from, in this example, 5 to 100 μm for the calculation of each of the device sets. An extrapolation of the resistance to zero channel length allows determining the parasitic resistance. The channel width is kept constant for each device at 2 mm. FIGS. 5a and b show, respectively, output and transfer characteristics of a thin film transistor with a 10 μm channel length prepared under identical conditions as the thin film transistor as analysed in FIGS. 4a and b.

The improvement in parasitic resistance when doping the semiconductor as described herein may be analysed by comparing thin film transistors with doped semiconductors to thin film transistors with undoped semiconductors, whereby the devices are prepared under identical conditions.

Figure 6A:
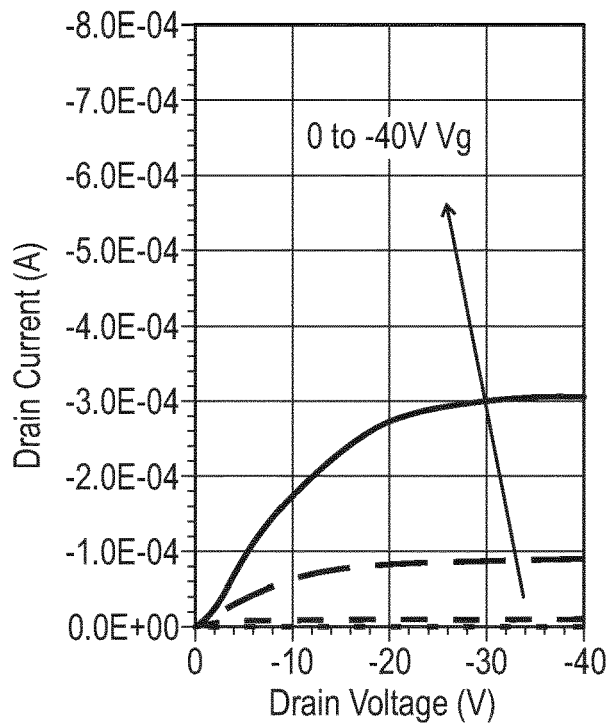
FIGS. 6a and b show, respectively, output characteristics and transfer characteristics of an undoped thin film transistor with a 5 μm channel length.
Figure 6B:
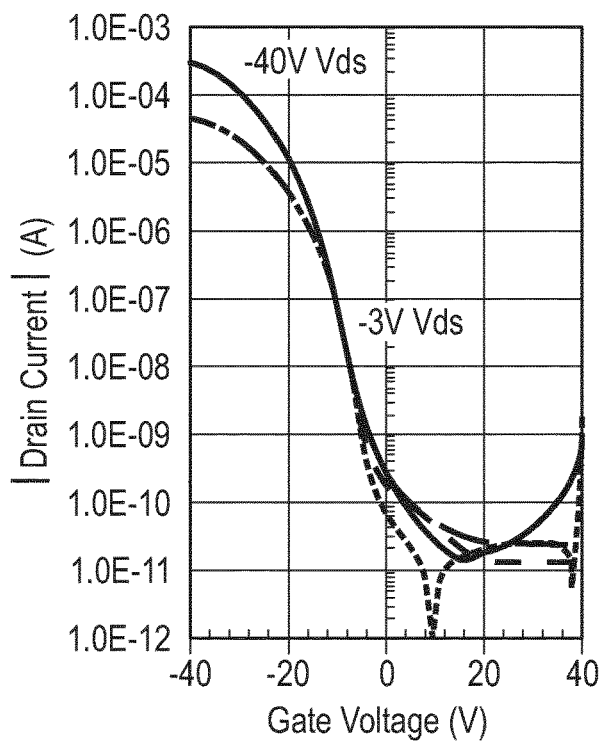
Figure 7A:
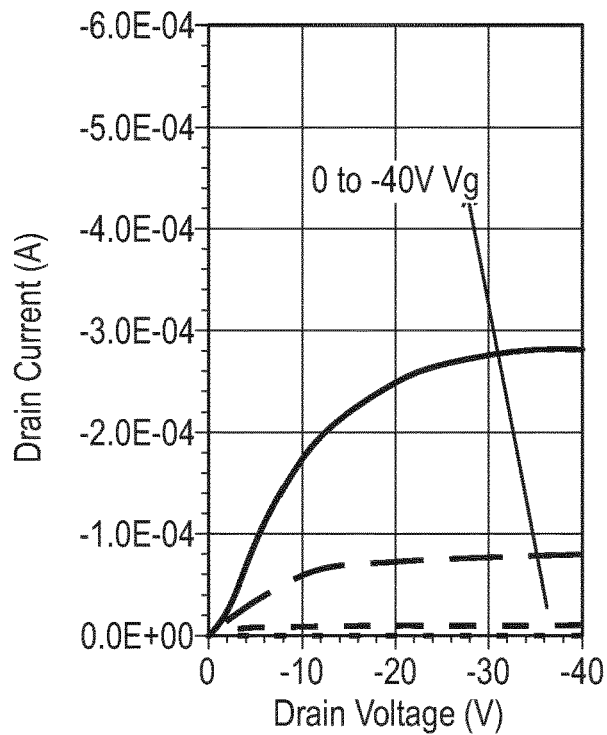
FIGS. 7a and b show, respectively, output characteristics and transfer characteristics of an undoped thin film transistor with a 10 μm channel length.
Figure 7B:
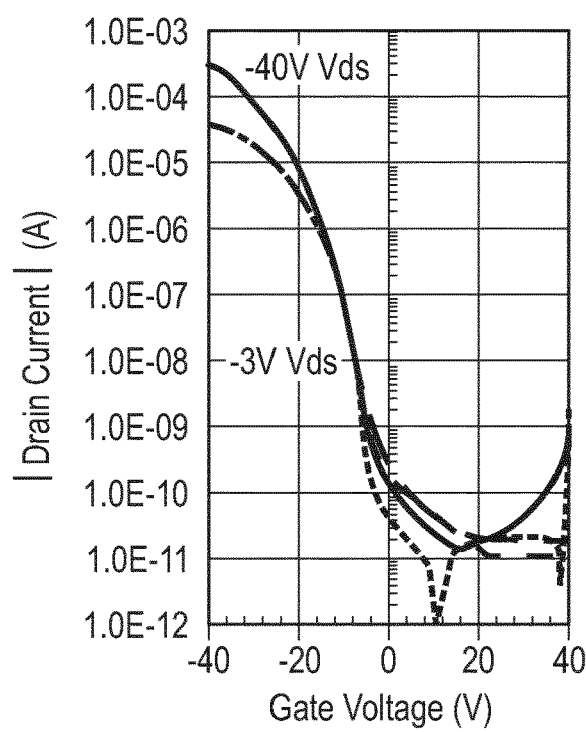

FIGS. 6a and b illustrate, respectively, output and transfer characteristics of an undoped thin film transistor prepared under identical conditions as the thin film transistor analysed as shown in FIGS. 4a and b (channel length 5 μm). FIGS. 7a and b show, respectively, output and transfer characteristics of a corresponding undoped thin film transistor with a channel length of 10 μm.

A third set of devices is prepared in which the host solvent (in this example Dimethyl sulfoxide (DSMO)) for the dopant is deposited at the source and drain electrode regions, whereby no dopant is dissolved in the host solvent. This allows assessing the impact of the printing of the host solvent itself on device performance.

Figure 8A:
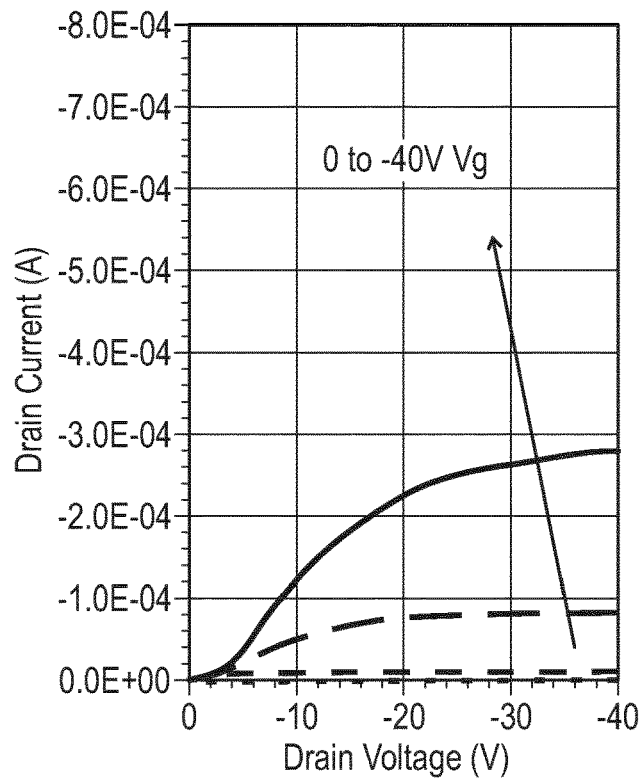
FIGS. 8a and b show, respectively, output characteristics and transfer characteristics of a transistor with a host solvent printed at the contacts and a 5 μm channel length.
Figure 8B:
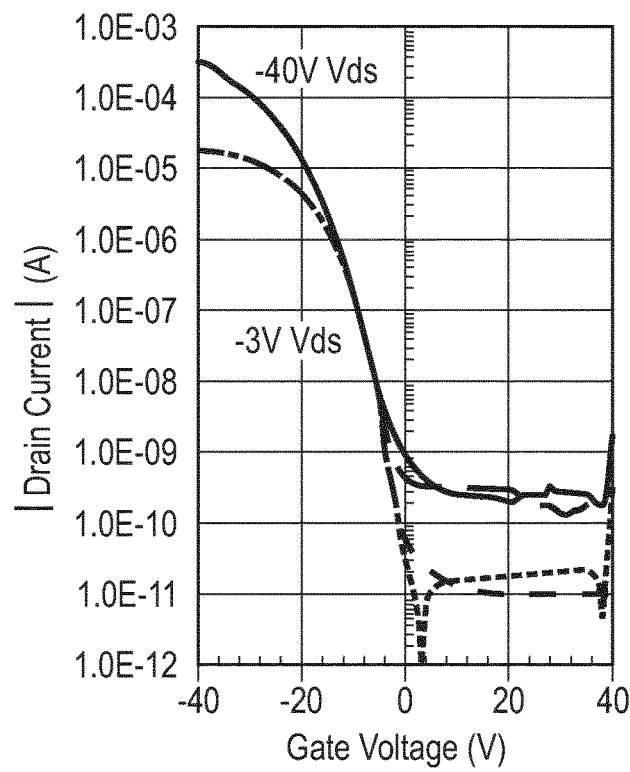
Figure 9A:
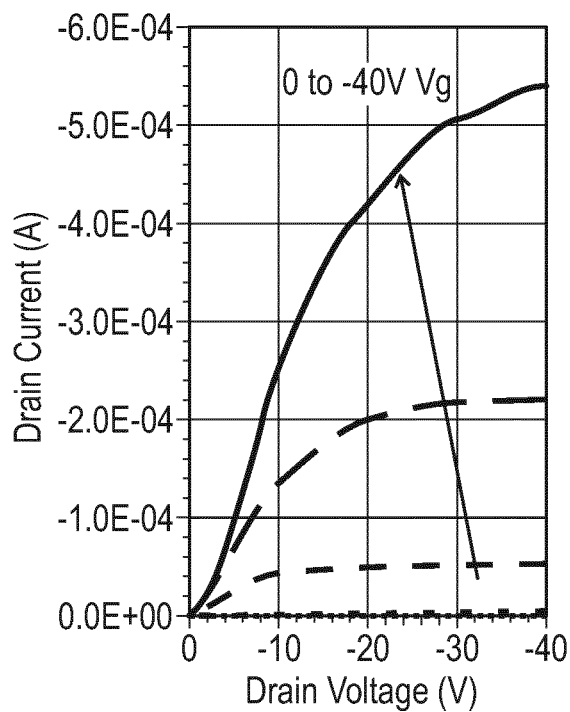
FIGS. 9a and b show, respectively, output characteristics and transfer characteristics of a transistor with a host solvent printed at the contacts and a 10 μm channel length.
Figure 9B:
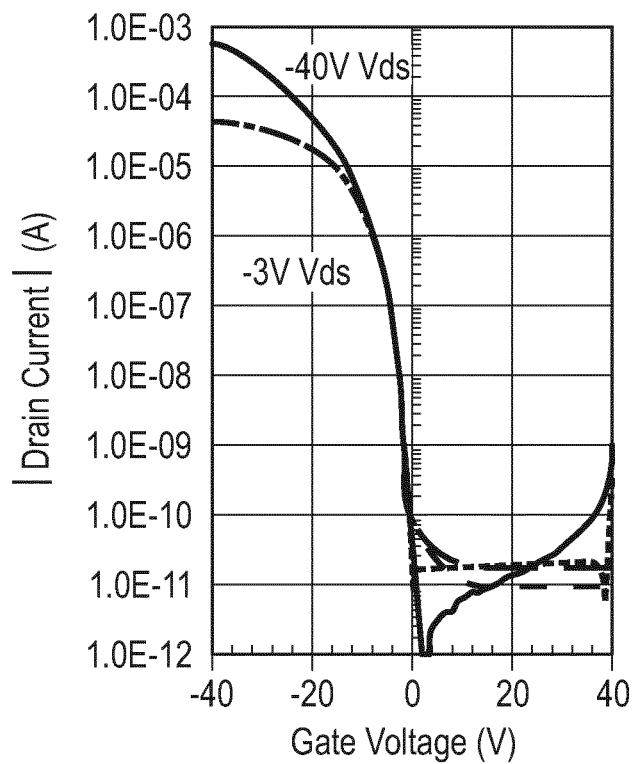

FIGS. 8a and b show, respectively, output and transfer characteristics of a thin film transistor prepared under identical conditions as the devices analysed in FIGS. 4a and b (channel length: 5 μm). However, in the transistor as analysed in FIGS. 8a and b, no dopant is dissolved in the host solvent. FIGS. 9a and b show, respectively, output and transfer characteristics of a corresponding thin film transistor with a channel length of 10 μm.

In order to obtain the parasitic resistance for the three sets of devices (doped, undoped, and host solvent only printed onto the conducting electrode regions), the transmission line method is used.

Figures 10, 11:
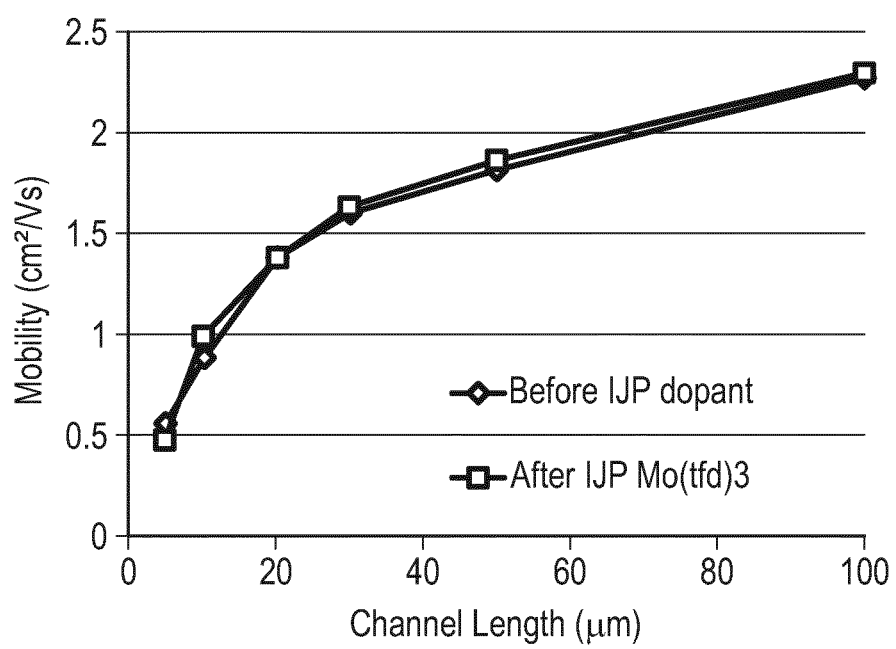
FIG. 10 shows parasitic resistance as a function of gate-source bias.
FIG. 11 shows peak saturation mobility before and after doping according to embodiments of the present invention.

The table in FIG. 10 shows the results for the obtained width-normalised parasitic resistance (values in kΩcm) as a function of gate-source bias for the dopant deposited adjacent the interface between the conducting source electrode region and the organic semiconductor, and the conducting drain electrode region and the organic semiconductor, respectively. In this example, the thin film transistors of this data set have a dielectric thickness of 287 nm and a normalised capacitance of 5.86 nF/cm².

It can be seen that in devices with the dopant printed at the conducting source and drain electrode regions, the parasitic resistance is reduced by a factor of approximately 3 compared to undoped reference devices. Furthermore, devices with the dopant printed at the conducting source and drain electrode regions exhibited lower parasitic resistance than those devices with printed host solvent only (i.e. no dopant in the solvent) at the conducting electrode regions.

The skilled person will appreciate that due to the nature of the process, device data is comparative from sample to sample, because every sample has a different transistor. Hence, fluctuations in performance may reveal differences in output current levels.

Nonetheless, a clear trend in improvement of parasitic resistance is observed for devices with dopants incorporated in the semiconductor adjacent the interface between the semiconductor and the respective conducting electrode regions.

FIG. 11 shows the peak saturation mobility as a function of channel length for thin film transistors before (blue, diamond data points) and after (red, square data points) doping of Mo(tfd)3 at the conducting source and drain electrode regions using the method illustrated in FIGS. 2a-d. It can be seen that, in this example, the mobility of the charge carriers is hardly affected by doping the semiconductor at the conducting source and drain electrode regions.

Figures 12A, 12B:
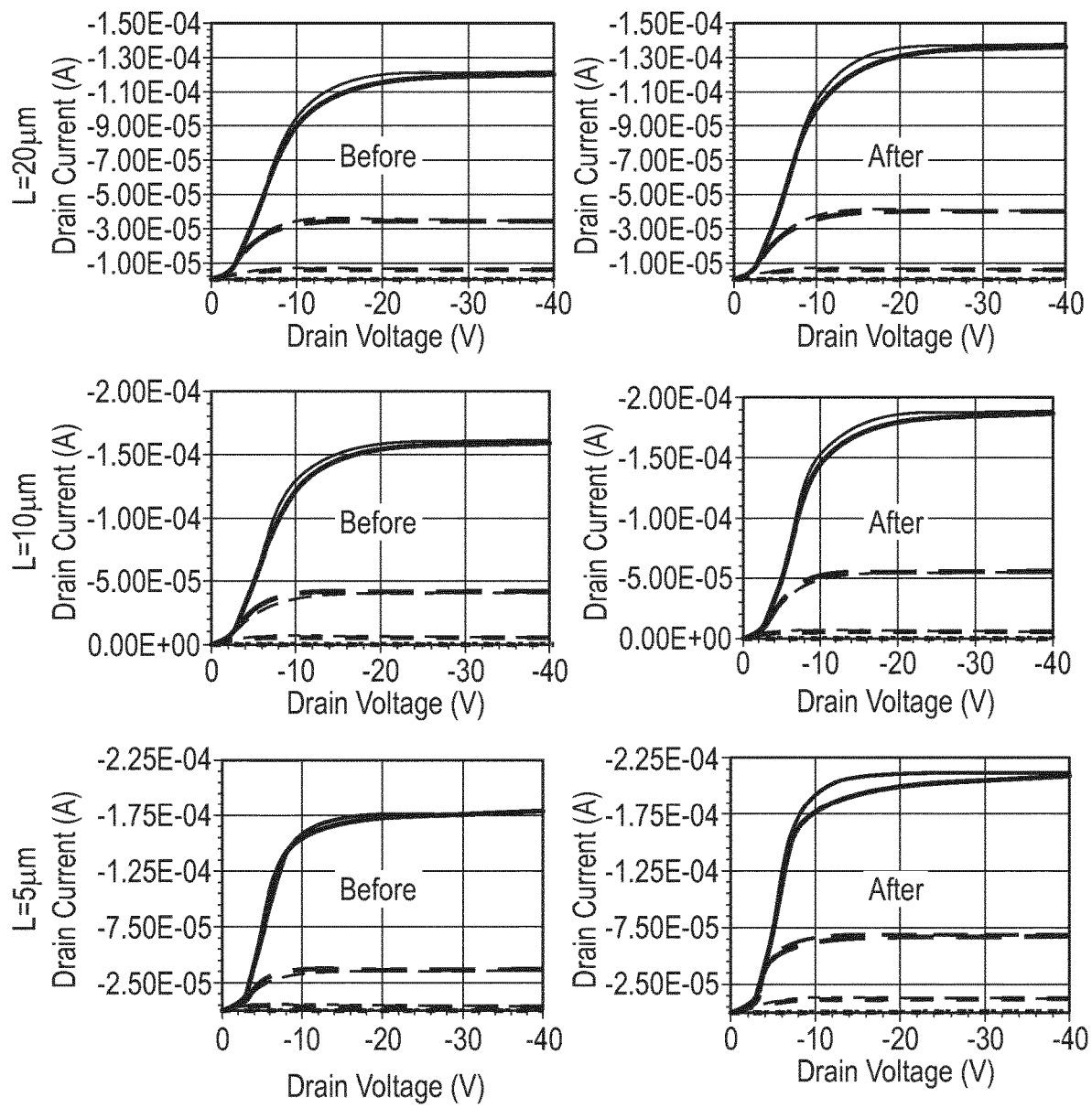
FIGS. 12a-c show output characteristics, parasitic resistance and transfer characteristics before and after doping according to embodiments of the present invention.

In order to determine the effect of Mo(tfd)3 doping on the parasitic resistance by applying the transmission line method, thin film transistors with varying channel lengths are prepared. FIG. 12a shows output characteristics before and after doping of a series of transistors with channel lengths from 5 to 20 µm. An increase in output current levels is observed for devices doped with Mo(tfd)3 for all channel lengths and gate voltages.

The gate-bias dependent parasitic resistance for undoped and Mo(tfd)3-doped transistors is obtained by applying the transmission line method to the data of FIG. 12a. The result is shown in FIG. 12b (values for parasitic resistance in kΩcm).

It can be concluded that the improvement in device performance can be attributed to a reduced parasitic resistance between semiconductor and conducting source and drain electrode region, respectively, after doping the semiconductor with Mo(tfd)3.

Figure 12C:
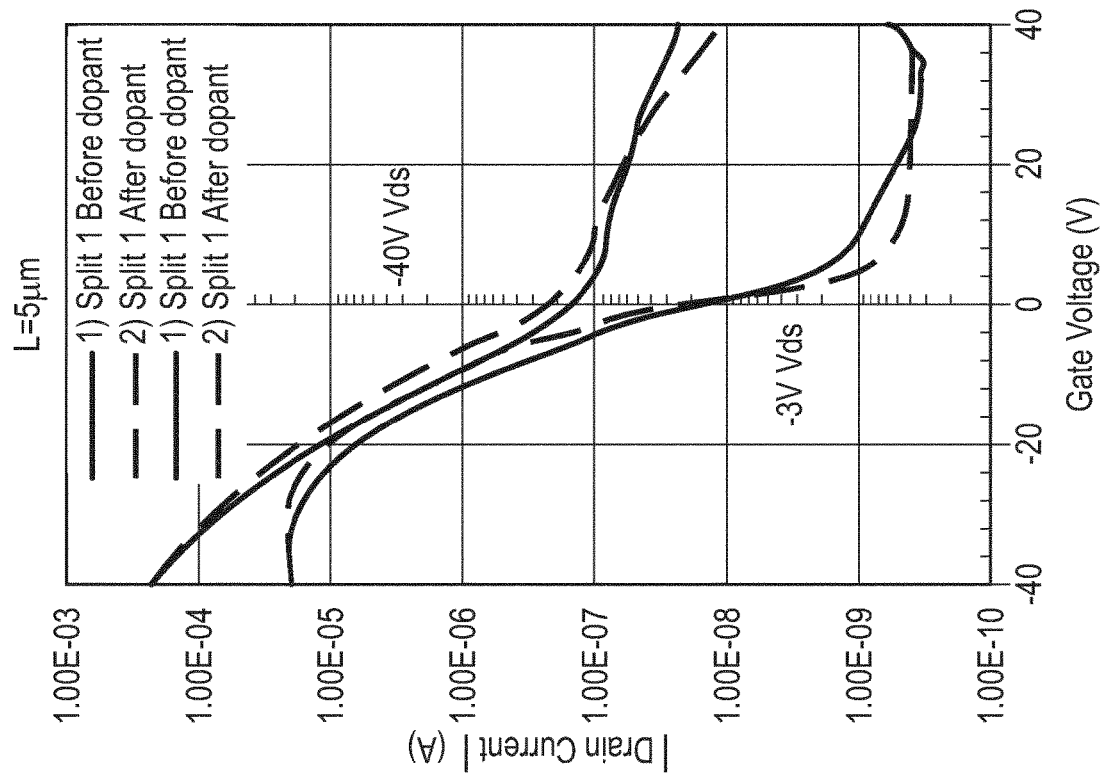
Figure 12C:
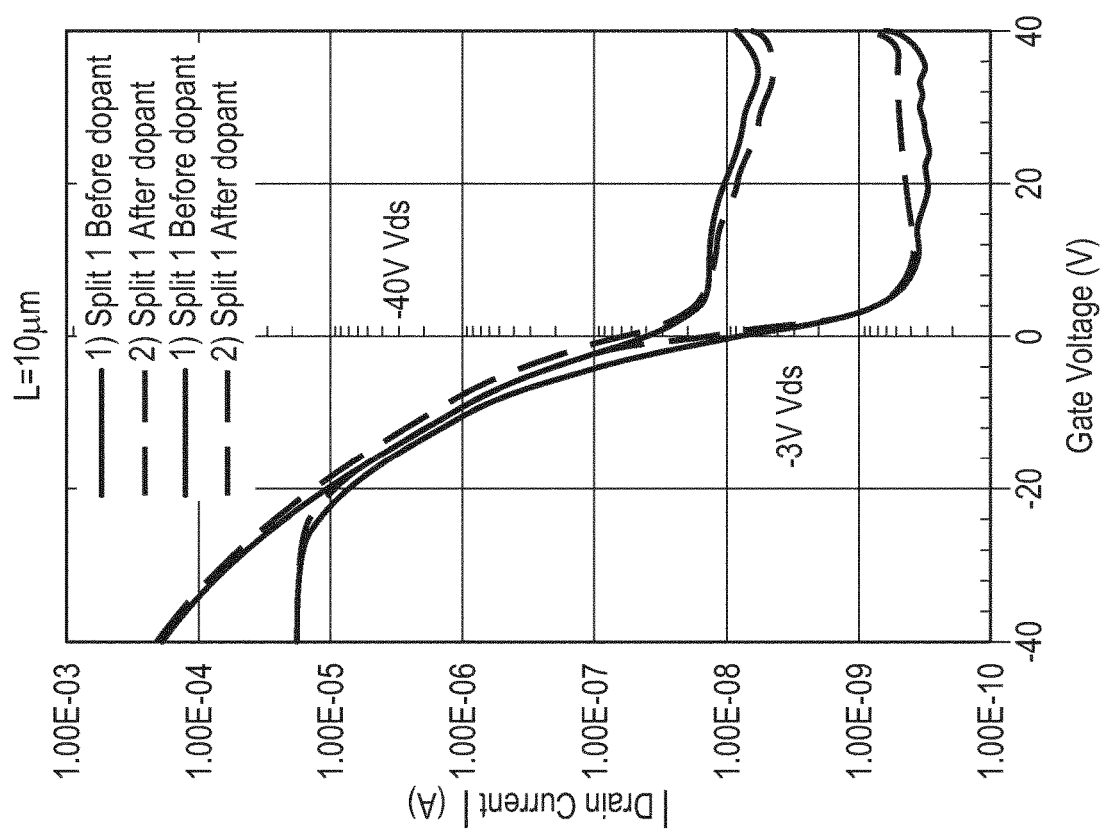

Transfer characteristic data corresponding to devices before and after the printing of Mo(tfd)3 dopant at the conducting source and drain electrode regions are shown in FIG. 12c for 5 µm and 10 µm channel length devices. The different curves are attributed to different source-drain voltages (Vds=−3V and Vds=−40V). It can be seen that in the on-state of the thin film transistor (negative gate voltage), the drain current increases after doping (note the logarithmic scale). Furthermore, the off-current levels are on the same order before and after doping, indicating that doping of the channel region is prevented using the methods described herein.

A further set of reference devices is prepared and tested with the host solvent (in this example DSMO) printed at the conducting electrode regions with device data taken before and after the printing of the solvent. No dopant is dissolved in the solvent. These samples are used to assess if the improved parasitic resistance results obtained may be explained by a solvent annealing effect.

Figures 13A, 13C:
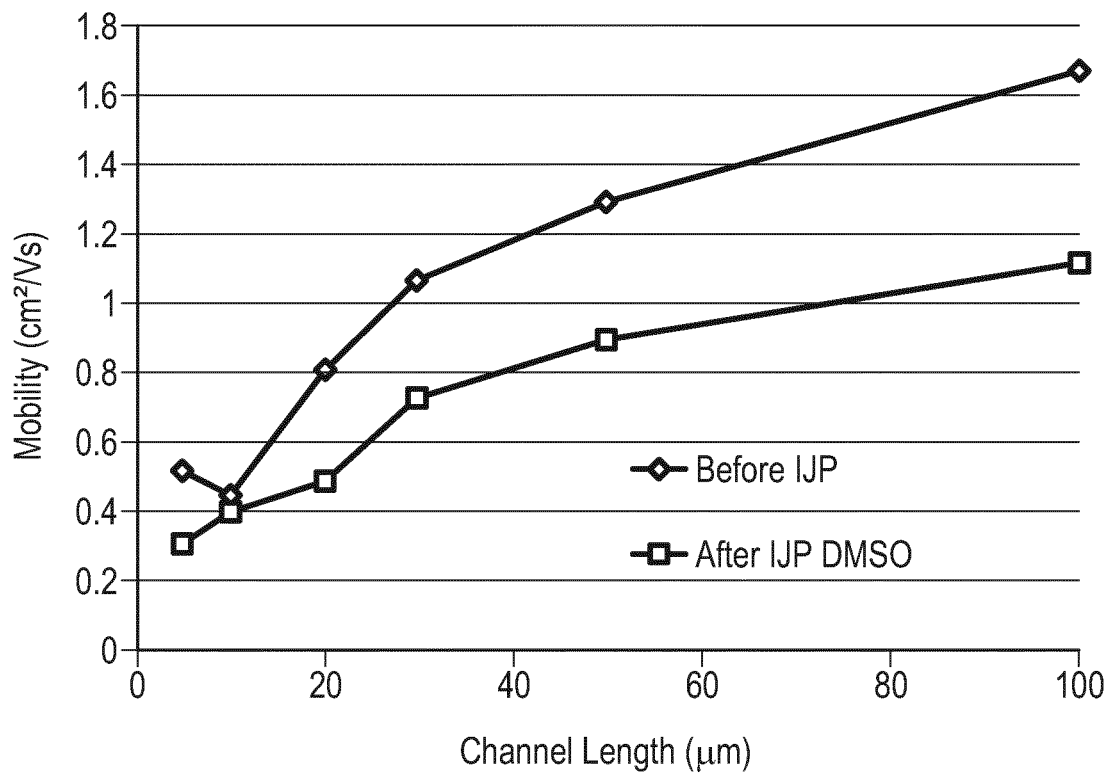
FIGS. 13a-d show peak saturation mobility, output characteristics, parasitic resistance and transfer characteristics before and after host solvent deposition.

FIG. 13a shows peak saturation mobility as a function of channel length for a series of devices with and without DSMO solvent only (i.e. without dopant in the solvent) printed at the conducting source and drain electrode regions. A significant decrease in charge carrier mobility is observed when DSMO is deposited at the conducting electrode regions.

Figure 13B:
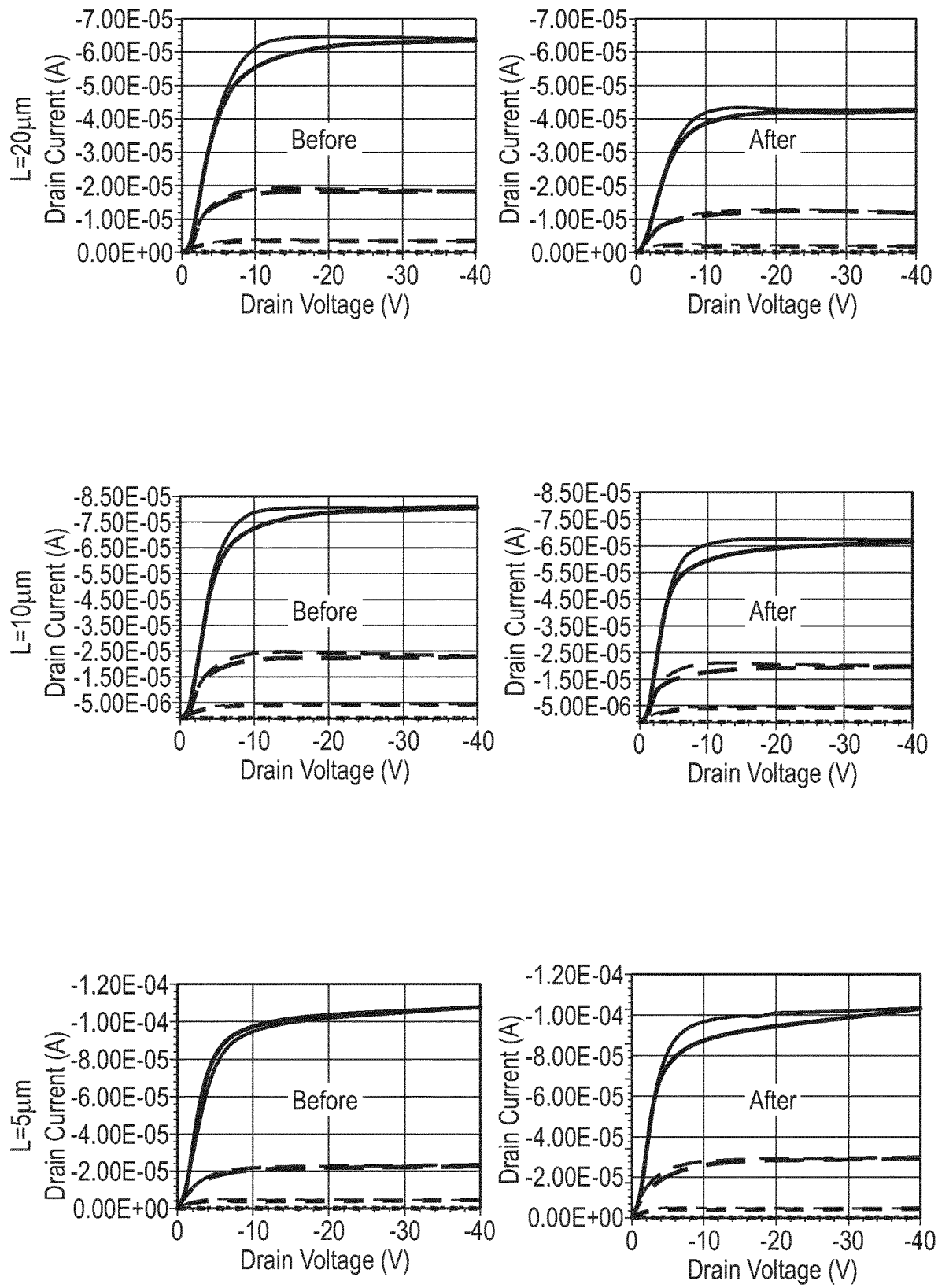

The corresponding output characteristics are shown in FIG. 13b for varying channel lengths (5-20 µm). A decrease in drain current is observed after deposition of DSMO.

The transmission line method is applied to the data shown in FIG. 13b in order to determine the parasitic resistance. The gate-bias dependent parasitic resistance before and after deposition of DSMO at the conducting electrode regions is shown in the table of FIG. 13c (values for parasitic resistance in kΩcm). Only a negligible change in parasitic resistance is observed for all gate voltages.

Figure 13D:
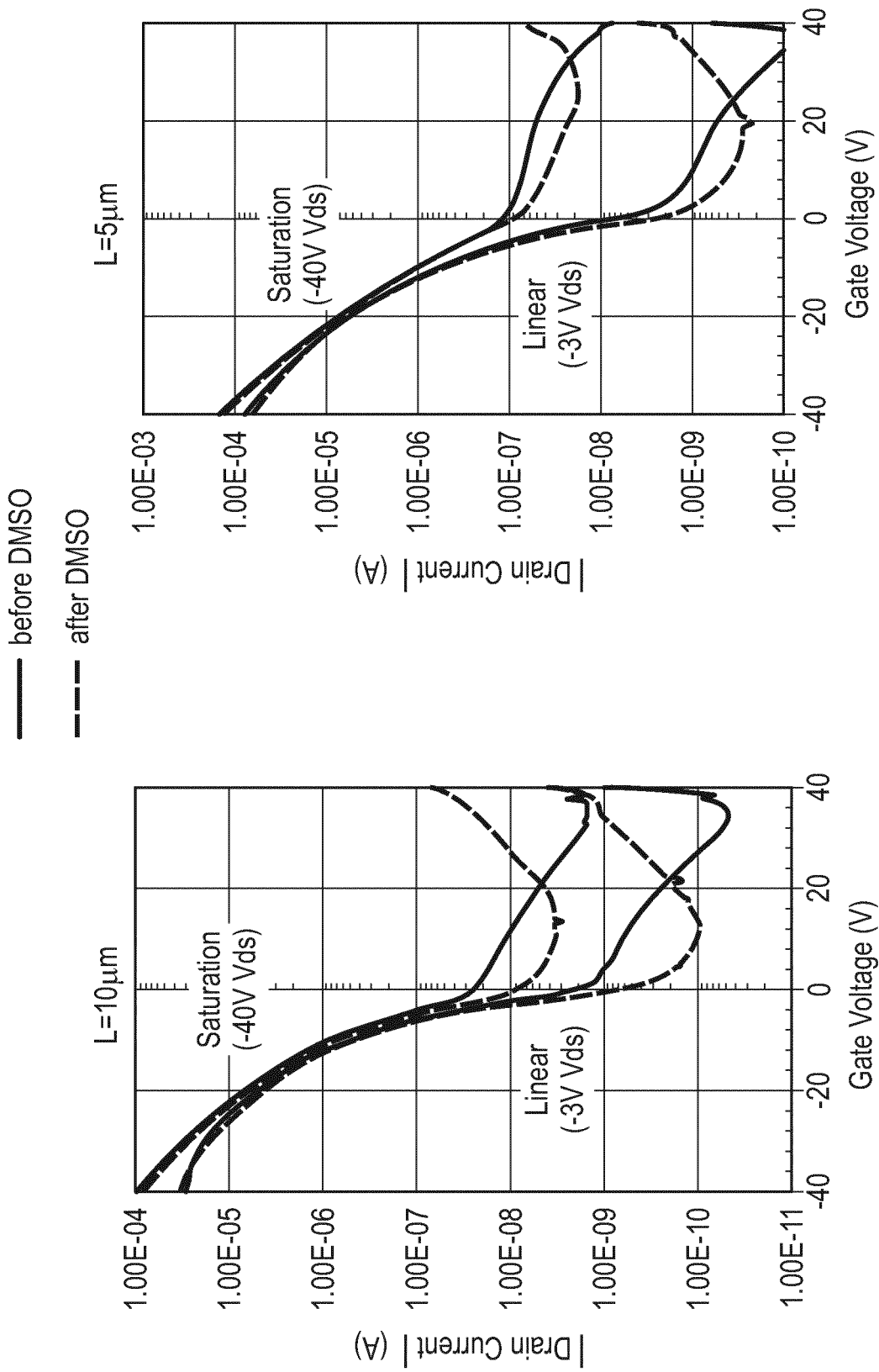

The decrease in mobility after deposition of the DSMO solvent only (i.e. without dopant in the solvent) at the conducting electrode regions manifests itself in the device performance as shown in the transfer characteristics of FIG. 13d. The drain current decreases when DSMO is deposited (green curve) at the conducting electrode regions (note the logarithmic scale).

The parasitic resistance analysis as well as the output and transfer characteristic data indicate that the improvement in the device performance upon doping the semiconductor is not attributed to a solvent annealing effect.

Further to the Mo(tfd)3 dopant, devices were prepared using F4-TCNQ as a dopant. In order to compare F4-TCNQ doping to Mo(tfd)3 doping, the same host solvent, DSMO, is used.

Figures 14, 15B:
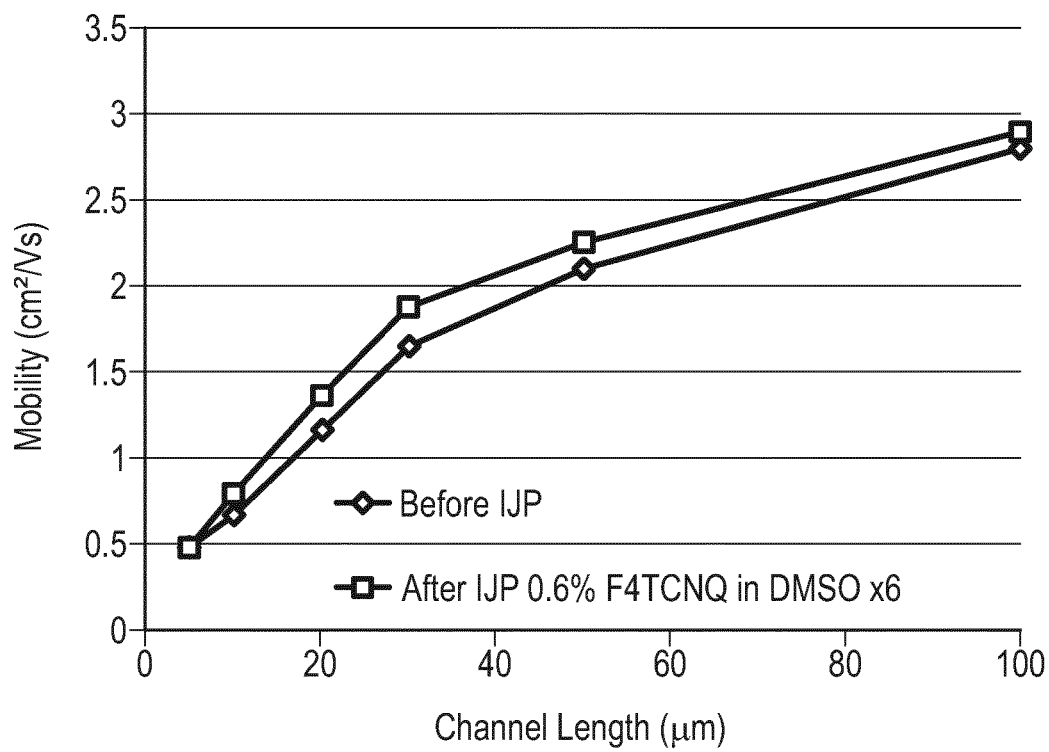

FIG. 14 shows the peak saturation mobility as a function of channel length for thin film transistors before (blue, diamond data points) and after (red, square data points) doping of F4-TCNQ at the conducting source and drain electrode regions using the method as illustrated in FIGS. 2a-d. It can be seen that the mobility of the charge carriers only slightly increases when the semiconductor is doped with F4-TCNQ at the conducting source and drain electrode regions. The mobility is less affected by the dopant for channel lengths of less than 10 µm, and for channel lengths of more than 100 µm. No measureable change in mobility upon F4-TCNQ-doping is observed for a channel length of approximately 5 µm.

In order to determine the effect of F4-TCNQ doping on the parasitic resistance by applying the transmission line method, thin film transistors with varying channel lengths are prepared. FIG. 15a shows output characteristics before (red curves) and after (green curves) doping of a series of transistors with channel lengths varying from 5 to 20 µm. An increase in output current levels is observed for devices doped with F4-TCNQ for all channel lengths.

The gate-bias dependent parasitic resistance for undoped and F4-TCNQ-doped transistors is obtained by applying the transmission line method to the data of FIG. 15a. The result is shown in FIG. 15b (values for parasitic resistance in kΩcm).

It can be seen that the parasitic resistance decreases by approximately a factor of 1.1 to 1.2 when the semiconductor is doped with F4-TCNQ at the conducting source and drain electrode regions.

Figure 15C:
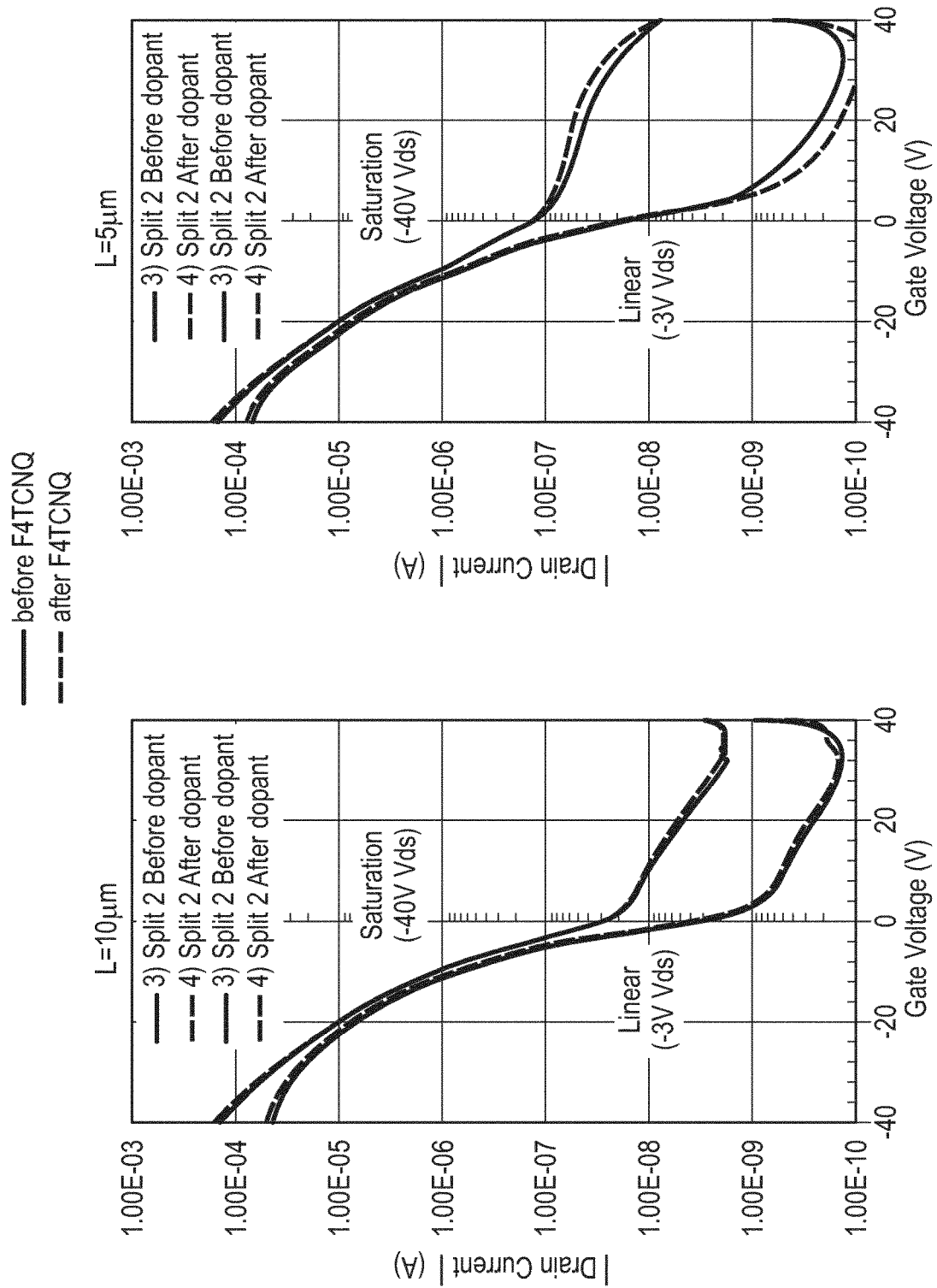

Transfer characteristic data corresponding to devices before and after the printing of F4-TCNQ dopant at the conducting source and drain electrode regions are shown in FIG. 15c for 5 µm and 10 µm channel length devices. The different curves are attributed to different source-drain voltages (Vds=−3V and Vds=−40V). It can be seen that in the on-state of the thin film transistor (negative gate voltage), the drain current increases slightly after doping (note the logarithmic scale). Furthermore, the off-current levels are on the same order before and after doping, indicating that doping of the channel region is prevented using the methods described herein.

As noted for devices with Mo(tfd)3 dopant solution printed at the conducting electrode regions, devices with F4-TCNQ dopant also exhibit improved output characteristic current levels and reduced parasitic resistance. The improvements in output current levels are similar to those obtained with Mo(tfd)3, i.e. approximately 10 to 15% compared to the same devices prior to the dopant being introduced.

Inkjet-printing is used in this example as a method for delivering electron acceptor materials for p-type based thin film transistors by using solutions comprising dopants such as Mo(tfd)3 or F4-TCNQ. Inkjet-printing (the one example used here) facilitates the possibility to use the same types of dopants, but may be delivered in a more flexible manner (density of printed features, options for higher resolution deposition, etc.), as outlined above.

All dopants required may be introduced by a solution method and form bulk films rather than surface treatments of the electrodes for work function shifting. Dopants may be used in an asymmetric fashion as outlined above since the dopant is added after the semiconductor film (or entire device stack) is in place. Asymmetric devices may constitute dopants at only one of the conducting electrode regions and/or different dopant materials for conducting source and drain electrode regions, respectively. Additionally, dopants at different concentrations at different regions of the device are possible with the methods described herein.

Example Fabrication Route A

Fabrication route A relates to the schematic illustrations of the first example fabrication route for doping a semiconductor as shown in FIGS. 1a-c.

Figure 16A:
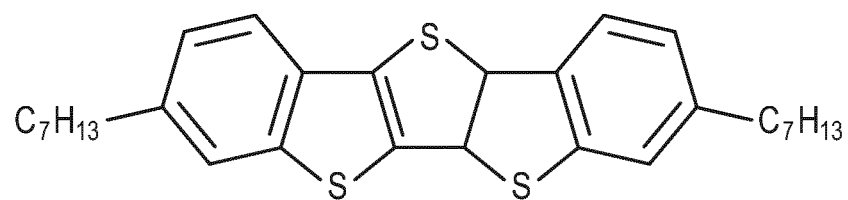
FIGS. 16a-c show small molecule and polymers.
Figure 16B:
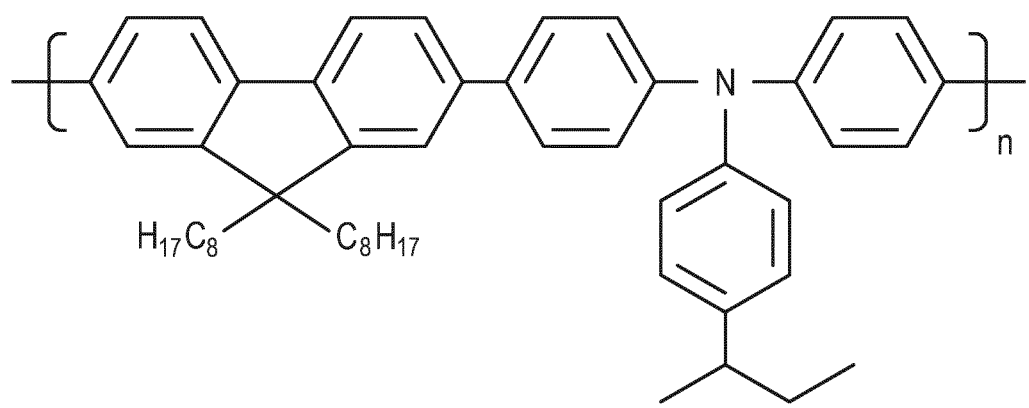

The semiconductor used in this example fabrication route is a small molecule/polymer mixture comprising two components. The fraction of each component by mass is: 35% small molecule (see FIG. 16a), 65% polymer (see FIG. 16b).

The semiconductor mixture is dissolved in a solvent mixture of tetrahydronaphthalene (70% by volume) and ortho-xylene (30% by volume) at a concentration of 10 mg solid to 1 ml solvent.

The semiconductor mixture is spin coated to a thickness of 49 nm.

The gate insulator thickness amounts to 287 nm.

The dopant is NovaLED® NDP-9, which is dissolved in benzonitrile (10 mg solid per 1 ml solvent).

The printing parameters of the dopant solution in this example are as follows:

Printing droplets (each droplet has a volume of approximately 8 pl) at a distance of 20 μm over a distance of 2 mm (the entire channel width) at each the source and drain electrodes.

The gate electrode is a bilayer structure comprising 5 nm chromium and 300 nm aluminium.

Example Fabrication Route B

Fabrication route B relates to the schematic illustrations of the example fabrication route for doping a semiconductor as shown in FIGS. 2a-d.

Figure 16C:
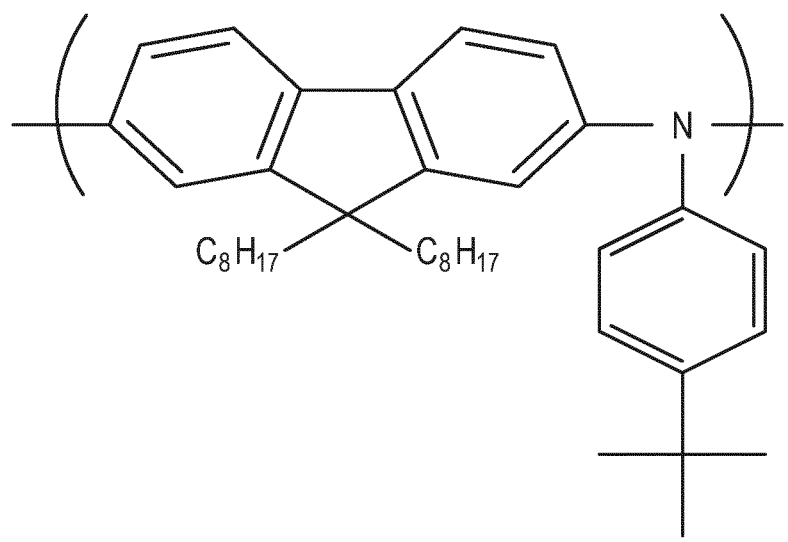

The semiconductor used in this example fabrication route is a small molecule/polymer mixture comprising two components. The fraction of each component by mass is: 25% small molecule (see FIG. 16a), 75% polymer (see FIG. 16c).

The semiconductor mixture is dissolved in ortho-xylene at a concentration of 12 mg solid to 1 ml solvent.

The semiconductor mixture is spin coated to a dried film thickness of 35 nm. The semiconductor film is dried by heating on a hotplate starting from 60 deg C., and ramping the temperature to 80 deg C. over a period of 12 minutes. The temperature is then held at 80 deg C. for a further 5 minutes.

The gate insulator thickness amounts to 325 nm. The insulator film is dried by heating on a hotplate starting from 60 deg C., and ramping the temperature to 80 deg C. over a period of 12 minutes. The temperature is then held at 80 deg C. for a further 5 minutes.

The dopants used are Molybdenum tris-[1,2-bis(trifluoromethyl)ethane-1,2-dithiolene (Mo(tfd)3) or 2,3,5,6-tetrafluoro-7,7,8,8-tetracyanoquinodimethane (F4-TCNQ). Mo(tfd)3 is dissolved in dimethylsulfoxide at a concentration in the range of 2 to 3 mg per 1 ml solvent. F4-TCNQ is dissolved in dimethylsulfoxide at a concentration in the range of 2 to 6 mg per 1 ml solvent.

The printing parameters of the dopant solution in this example are as follows:

Printing droplets (each droplet has a volume of approximately 8 pl) at a distance of 100 μm over a distance of 2 mm (the entire channel width) at 200 Hz onto the conducting source electrode region at a substrate temperature of 40 deg C. The substrate is heated, in this example, to enhance the diffusion of the dopant into the semiconductor. The number of repeated interdigitated printing passes at the edge of the gate is 6.

The gate electrode is a bilayer structure comprising 5 nm germanium and 100-200 nm aluminium.

The photoresist is a Shipley S1813 resist, which is coated to a thickness of 1500 nm. The photolithography conditions used in this example route are as follows:

Spin coating of Shipley S1813 photoresist (approximate thickness 1500 nm) and soft-baking at 110 deg C. for 6 minutes in air. The exposure of the photoresist is conducted for 19 seconds at 105 mW/cm$^2$. The development of the photoresist is conducted by using an aqueous solution of tetramethylammonium hydroxide (2.38%) and subsequent water rinsing at room temperature followed by spin drying to remove excess water from the substrate. The aluminium gate electrode is etched using a sequential process of water rinses and etchant based on an aqueous solution comprising acetic acid (1-10% by volume), nitric acid (1-10% by volume) and phosphoric acid (50-70% by volume). An initial water rinse is followed by etchant and two separate rinse steps at room temperature followed by spin drying to remove excess water from the substrate.

The dry etching process for the devices is based on an oxygen plasma process (200 W power, 50 seconds) in order to remove the germanium coated insulator and semiconductor films to the source and drain electrode region in the device. After completion of the dry etch process, an acetone spin rinse step is used in order to remove the photoresist layer prior to inkjet-printing. An example image of the gate electrode is shown in FIG. 3.

Overlap distances of the gate electrode to the underlying source and drain electrode regions are typically 40 to 50 μm (to each of the source and drain electrode regions).

In summary, unlike for electronic doping of inorganic semiconductors by high temperature diffusion and activation, the present process is a low temperature chemical/redox doping process. The dopant is advantageously selectively deposited by inkjet printing after the metal source drain contacts are formed, and the gate electrode is not used as a mask. The dopant is printed on top of metal source and drain electrodes or onto an organic semiconductor (OSC) on top of the metal source and drain electrodes. Thus the dopant stays close to the metal OSC interface after manufacture.

No doubt many other effective alternatives will occur to the skilled person. It will be understood that the invention is not limited to the described embodiments and encompasses modifications apparent to those skilled in the art and lying within the spirit and scope of the claims appended hereto.

The invention claimed is:

1. A method for reducing a parasitic resistance at an interface between a conducting electrode region and an organic semiconductor in a thin film transistor, the method comprising:
 depositing an insulating layer onto said organic semiconductor;
 providing a solution comprising a dopant for doping said semiconductor; and
 depositing said solution onto said organic semiconductor and/or said conducting electrode region to selectively dope said organic semiconductor adjacent said interface between said conducting electrode region and said organic semiconductor, wherein the conducting electrode region extends beyond an outer surface of the organic semiconductor during said depositing,
 wherein depositing said solution comprises inkjet-printing said solution, and wherein the selectively doped portions of said organic semiconductor and/or said conducting electrode region are arranged between said conducting electrode region and the insulating layer.

2. A method as claimed in claim 1, wherein said conducting electrode region comprises a first conducting electrode region and a second conducting electrode region, and wherein depositing said solution comprises depositing said solution onto one or both of said first conducting electrode region and said second conducting electrode region.

3. A method as claimed in claim 2, wherein depositing said solution onto both of said first conducting electrode region and said second conducting electrode region comprises depositing a first solution comprising a first dopant onto said first conducting electrode region, and depositing a second solution comprising a second dopant onto said second conducting electrode region.

4. A method as claimed in claim 1, wherein said conducting electrode region comprises a first conducting electrode region and a second conducting electrode region, and wherein the method comprises doping said semiconductor at a first concentration adjacent an interface between said semiconductor and said first conducting electrode region, and doping said semiconductor at a second concentration adjacent an interface between said semiconductor and said second conducting electrode region.

5. A method as claimed in claim 1, wherein said dopant comprises a solution-processable electron acceptor material.

6. A method as claimed in claim 5, wherein said dopant is any one of Mo(tfd)3, F4-TCNQ or NDP-9.

7. A method as claimed in claim 1, wherein said dopant is incorporated into said organic semiconductor with a resolution of higher than 10 µm.

8. A method of making a sensor or display, said sensor or display comprising a transistor, said transistor comprising a semiconductor, wherein said semiconductor is doped using the method of claim 1.

9. A method as claimed in claim 1, further comprising removing a portion of the organic semiconductor from over the conducting electrode region and thereby causing the conducting electrode region to extend beyond the outer surface of the organic semiconductor.

10. A method for doping an organic semiconductor, the method comprising:
providing a substrate, said substrate bearing a conducting source electrode region and a conducting drain electrode region;
depositing said organic semiconductor onto said substrate such that said organic semiconductor forms a layer on said substrate;
depositing an insulating layer onto said organic semiconductor; and
printing a solution comprising a dopant onto said organic semiconductor in an area where said organic semiconductor layer covers a portion of each of said conducting source electrode region and said conducting drain electrode region such that each of said conducting source electrode region and said conducting drain electrode region extends beyond an outer surface of the organic semiconductor, to selectively dope said organic semiconductor in said area wherein the selectively doped portions of said organic semiconductor are arranged between said conducting electrode region and the insulating layer.

11. A method as claimed in claim 10, the method further comprising:
depositing a gate electrode onto said layer of gate insulator.

12. A method as claimed in claim 10,
wherein said step of depositing said organic semiconductor onto said substrate covers the conducting source electrode region and the conducting drain electrode region with the organic semiconductor, and
wherein the method further comprises removing a portion of the organic semiconductor from over each of the conducting source electrode region and the conducting drain electrode region, thereby causing each of the conducting source electrode region and the conducting drain electrode region to extend beyond the outer surface of the organic semiconductor.

13. An organic electronic device comprising:
an electrode region;
a semiconductor layer comprising a dopant,
wherein said dopant dopes said semiconductor layer predominantly at an interface between the electrode region and said semiconductor layer, and
wherein the conducting electrode region extends beyond an outer surface of the organic semiconductor; and
an insulating layer, wherein the interface between the electrode region and the semiconductor layer is arranged between the electrode region and the insulating layer.

14. An organic electronic device as claimed in claim 13, wherein said organic electronic device is a thin film transistor, and wherein said electrode region is a source and/or drain electrode region.

15. An organic electronic device as claimed in claim 13,
wherein said dopant extends through the bulk of said semiconductor layer from said electrode region to an upper surface of said semiconductor layer, and
wherein a channel region of said organic electronic device is substantially free of said dopant.

16. An organic electronic device as claimed in claim 13,
wherein said dopant extends from said interface between said electrode region of said organic electronic device and said semiconductor layer to a lateral edge of said semiconductor layer, and
wherein a channel region of said organic electronic device is substantially free of said dopant.

17. An organic electronic device as claimed in claim 13, wherein said dopant dopes said semiconductor with a resolution of higher than 10 µm.

18. An organic electronic device as claimed in claim 13, wherein said semiconductor comprises an organic semiconductor.

19. A sensor or display comprising the organic electronic device as claimed in claim 13.

* * * * *